(12) United States Patent
Knapik et al.

(10) Patent No.: US 6,464,445 B2
(45) Date of Patent: Oct. 15, 2002

(54) SYSTEM AND METHOD FOR IMPROVED THROUGHPUT OF SEMICONDUCTOR WAFER PROCESSING

(75) Inventors: Brian M. Knapik; David K. Lawson, both of Glen Allen; Gregory O'Lyn Proctor, Chester, all of VA (US)

(73) Assignee: Infineon Technologies Richmond, LP, Sandston, VA (US)

( * ) Notice: Subject to any disclaimer, the term of this patent is extended or adjusted under 35 U.S.C. 154(b) by 0 days.

(21) Appl. No.: 09/740,125

(22) Filed: Dec. 19, 2000

(65) Prior Publication Data

US 2002/0076310 A1 Jun. 20, 2002

(51) Int. Cl.$^7$ .......................... B65G 49/07; H01L 21/68
(52) U.S. Cl. ........................... 414/416.03; 414/416.08; 414/937; 414/941; 118/728; 432/253; 211/41.18
(58) Field of Search ........................... 414/416.03, 941, 414/416.07, 416.08, 937; 118/728; 432/253; 211/41.18

(56) References Cited

U.S. PATENT DOCUMENTS 5,618,351 A  *  4/1997  Koble, Jr. et al. ........... 118/728
5,679,168 A  *  10/1997  Porter et al. ................. 118/725
6,132,160 A  *  10/2000  Iwai ....................... 414/416.03

FOREIGN PATENT DOCUMENTS

JP          2228048    *   9/1990   ................. 414/941
JP          8316158    *   11/1996

* cited by examiner

*Primary Examiner*—Steven A. Bratlie
(74) *Attorney, Agent, or Firm*—Stanton Bradan

(57) ABSTRACT

A system and method for improved throughput of semiconductor wafer processing. In one aspect, a wafer carrier is provided having a flat zone capable of holding an additional lot of wafers for processing. In addition, a multiple fork wafer transfer mechanism is provided having a plurality of wafer forks for loading and unloading wafers in the wafer carrier at a reduced fork pitch.

14 Claims, 4 Drawing Sheets

SYSTEM AND METHOD FOR IMPROVED THROUGHPUT OF SEMICONDUCTOR WAFER PROCESSING

BACKGROUND OF THE INVENTION

1. Technical Field

The present invention relates generally to semiconductor wafer processing, and more particularly, to a system and method for improved throughput of wafers comprising an improved wafer carrier for holding additional wafers in its flat zone during processing and an improved multiple fork wafer transfer mechanism for loading and unloading wafers in the improved wafer carrier.

2. Discussion of Related Art

In the manufacture of microelectric circuits, use is commonly made of microscopic transistors and diodes in the form of generally square chips. In the manufacture of such "chips," thin wafers are cut from rods of grown silicon crystal. Large numbers of these wafers are then treated to control their electrical conducting nature. The wafers may be subjected to washing, heating or gas diffusion treatments and thereafter diced by means of a high-speed abrasive saw into thousands of chips. The dopants used in the diffusion process may be vapors containing boron, phosphorus, or other materials.

To facilitate handling of these silicon-crystal wafers during processing, it is conventional to provide so-called "wafer boats" which are carriers or carrier frames made of high purity quartz or silicon carbide having rails with a number of wafer-receiving slots cut therein to support the wafers in vertical positions in the boat. The wafers are loaded onto the rails of the boat by a wafer transferring system, which includes forks for supporting and inserting wafers into the wafer-receiving slots. The loaded boat is placed in the reaction tube of a furnace for heating the wafers to required temperatures for processing. Each furnace can only hold one boat during a process run, and can only process wafers over a "flat zone" or highly stable temperature region of the boat.

Current wafer processing techniques can produce only a limited number of wafers. Improving productivity or "throughput" of wafers can be done by increasing the number of furnaces; however, this is costly and space-consuming.

Accordingly, an efficient, productive and effective technique and boat design for increasing load sizes and throughput of wafer processing without greatly increasing costs or space-requirements, is highly desirable.

SUMMARY OF THE INVENTION

The present invention is directed to a system and method for increasing throughput of wafer processing comprising an improved wafer carrier for holding additional wafers in its flat zone during processing and an improved multiple fork wafer transfer mechanism for loading and unloading wafers in the improved wafer carrier.

In one aspect of the present invention a system for improving throughput of semiconductor wafer processing for a wafer boat having a capacity of N product wafers is provided comprising a wafer carrier including a plurality of rails, the rails having a plurality of teeth for forming slots having a slot pitch for holding said semiconductor wafers, the wafer carrier being adapted to carry (N+y) product wafers in a flat zone while maintaining overall dimensions of the wafer boat, and a wafer transferring mechanism comprising a plurality of wafer forks for loading and removing said semiconductor wafers from the wafer carrier.

In another aspect of the present invention a method of improved throughput in processing semiconductor wafers for a wafer boat having a capacity of N product wafers is provided including the steps of providing a wafer carrier including a plurality of rails, the wafer carrier being adapted to carry an (N+y) number of product wafers in a flat zone while maintaining dimensions of the wafer boat; and providing a multiple fork wafer transfer mechanism having a plurality of wafer forks for loading and unloading the semiconductor wafers onto the wafer carrier.

These and other aspects, features, and advantages of the present invention will be described or become apparent from the following detailed description of the preferred embodiments, which is to be read in connection with the accompanying drawings.

DETAILED DESCRIPTION OF PREFERRED EMBODIMENTS

A system according to the present invention provides an improved wafer carrier and wafer transferring mechanism for increasing throughput of wafer processing. In particular, a wafer carrier according to the present invention has a flat zone capable of processing an additional lot of product wafers while maintaining its dimensions, thus advantageously producing an increased batch size at a minimum cost, since the increased throughput can be accomplished without the need, for example, for additional furnaces.

In addition, a wafer handling system according to the present invention increases the throughput of wafer processing without increasing the possibility of contamination; thus, an increased throughput is accomplished while maintaining the quality of product wafers produced.

Figure 1:
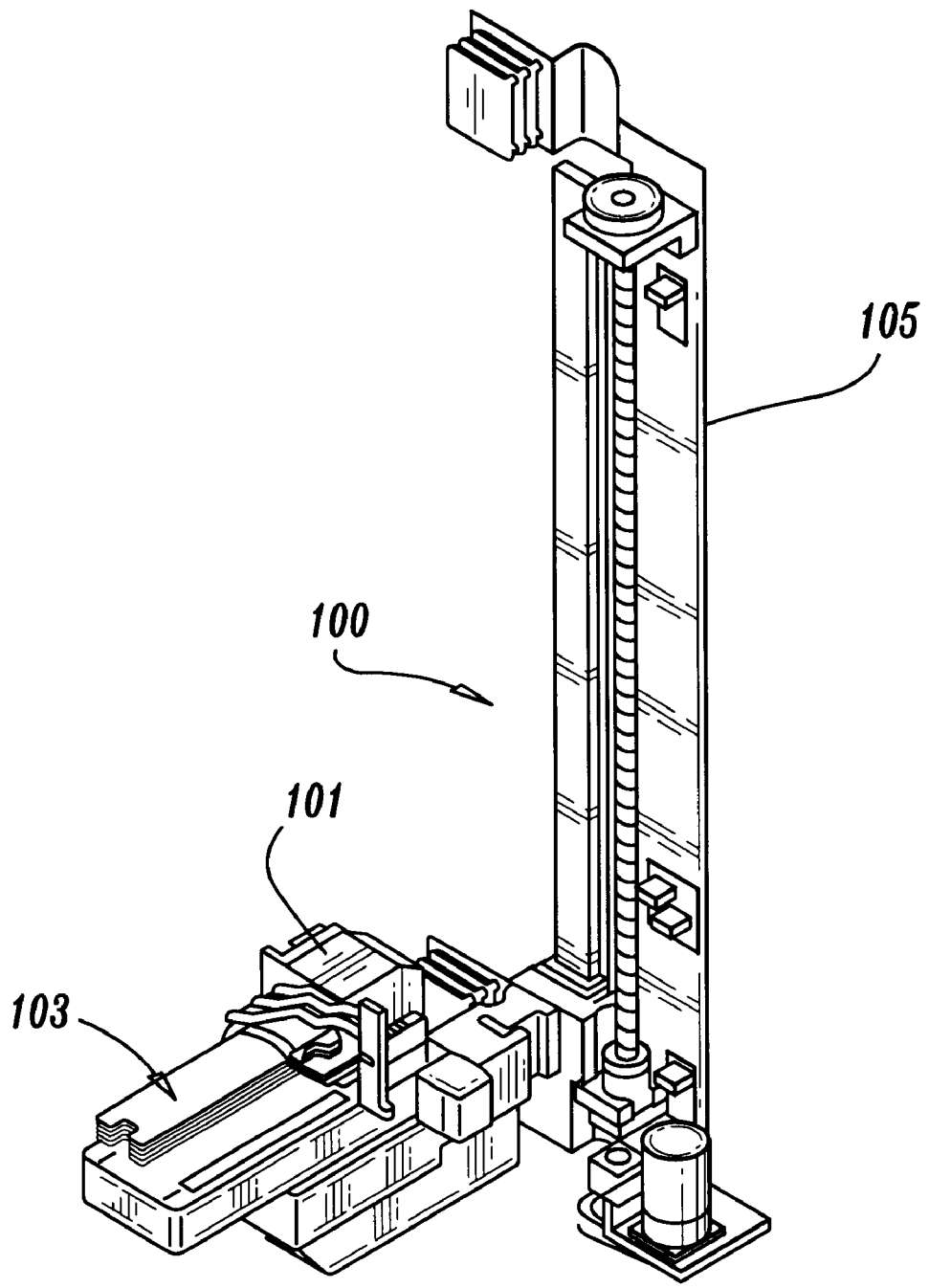
FIG. 1 is an exemplary illustration of a wafer handling system according to an aspect of the present invention.

FIG. 1 is an exemplary illustration of a wafer handling system 100 according to an aspect of the present invention. The wafer handling system 100 includes a multiple fork wafer transfer mechanism 101 for loading a plurality of wafers at one time onto a rail of a wafer carrier (not shown). Wafer carriers can be constructed, for example, of high purity quartz or silicon carbide (SiC) and can include various numbers of rails for holding wafers. In a preferred embodiment, the multiple fork wafer transfer mechanism 101 has 5 wafer forks 103 for loading 5 wafers at a time onto the wafer carrier.

The wafer handling system 100 also includes a lift 105 for lifting and adjusting a position of the wafer transfer mechanism 101 when loading and unloading cassettes or wafer carriers.

Figure 2:
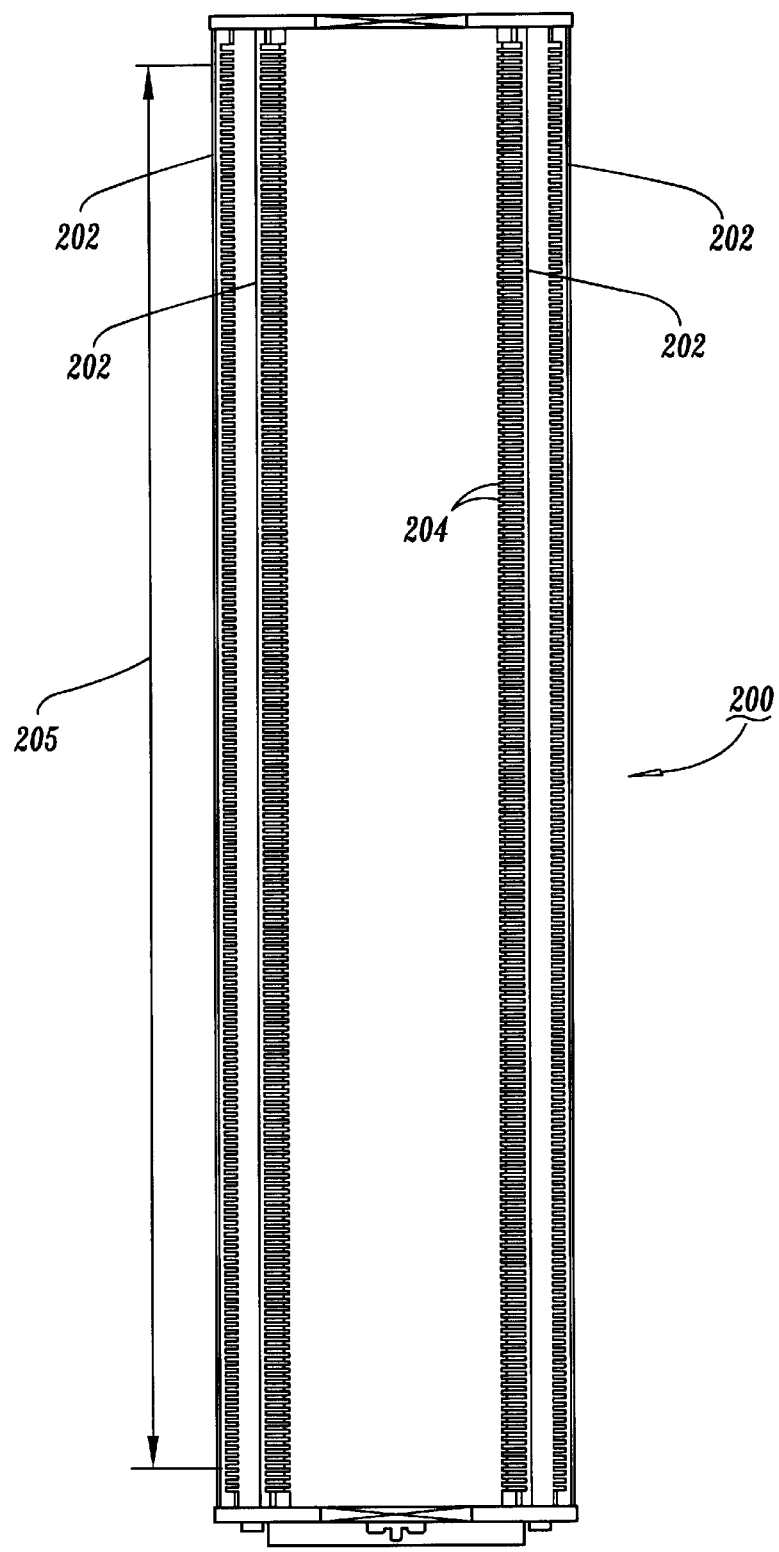
FIG. 2 is an exemplary illustration of a 4-rail wafer carrier according to an aspect of the present invention.

FIG. 2 is an exemplary illustration of a 4-rail wafer carrier 200 according to an aspect of the present invention. It is to be understood that other systems may be employed having different numbers of rails (e.g., 3 or 5). In a preferred embodiment, the 4-rail wafer carrier 200 is comprised of four rails 202 which are vertically-positioned columns having a plurality of teeth 204 for holding wafers during processing in a furnace. The rails 202 feature a flat zone 205 for processing product wafers. Since semiconductor wafers are manufactured by factories in lots of 25 per cassette, if a batch size of a wafer carrier is to be increased, it is desirable to do so in increments of 25 within the same flat zone length for maximum cost efficiency. While prior art wafer carriers are capable of processing an N number of product wafers having a flat zone length X, a wafer carrier 200 according to the present invention can process, for example, N+y product wafers in the same flat zone length X. Advantageously, a wafer carrier according to the present invention is capable of processing an additional lot y of e.g., 25 wafers within the same flat zone length X, thus resulting in an increased throughput without requiring additional furnaces, wafer carriers, etc.

Figure 3:
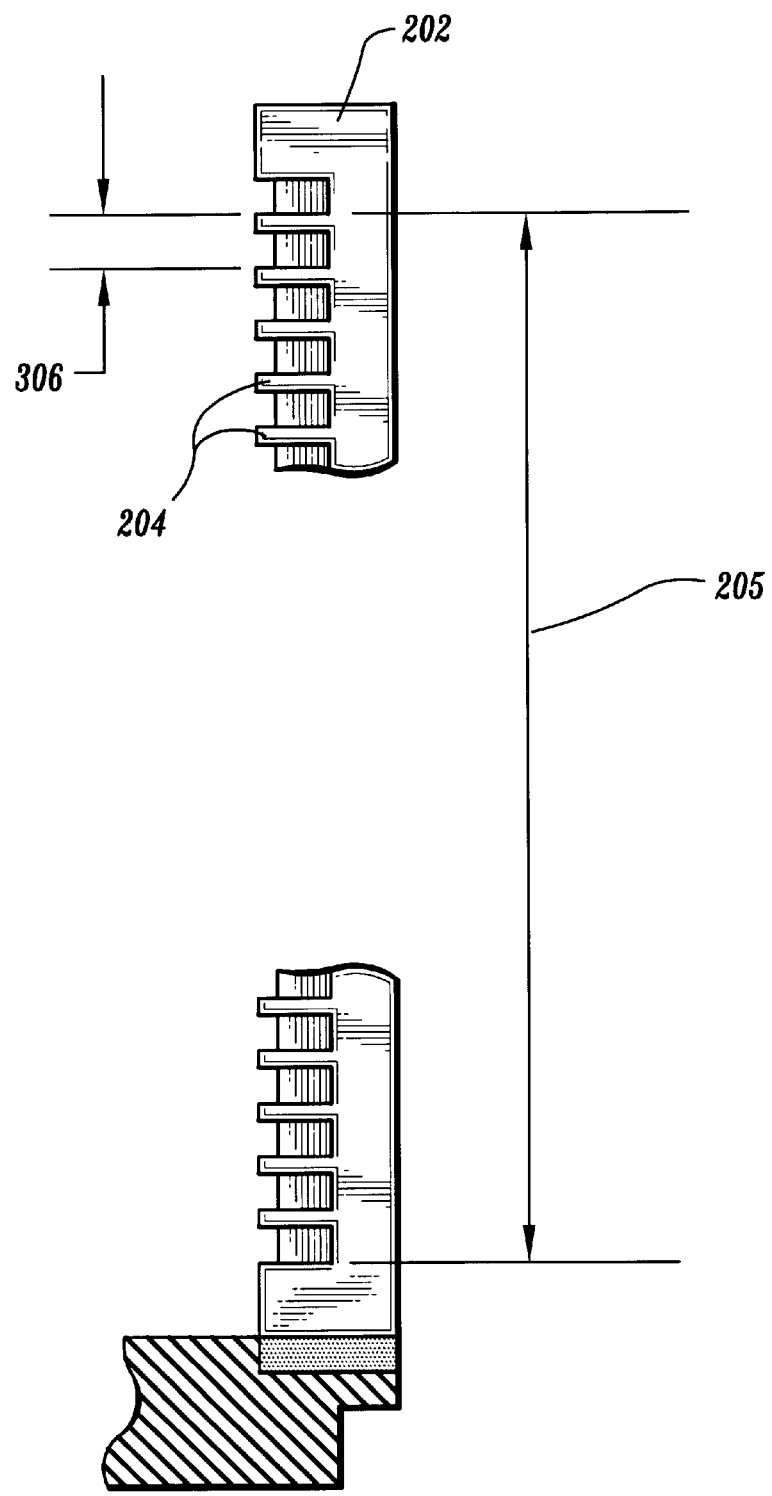
FIG. 3 is an exemplary illustration of a rail of the 4-rail wafer carrier of FIG. 2 according to an aspect of the present invention.

FIG. 3 is an exemplary illustration of a rail 202 according to an aspect of the present invention. In a preferred embodiment, the flat zone 205 of the rail 202 fits an additional lot of product wafers using a slot pitch 306. The slot pitch 306 is, for example, a distance between a top edge of adjacent teeth. For illustrative purposes, the slot pitch 306 has a measurement of between about 4.61 mm and about 4.81 mm which is preferably accomplished by reducing a width of each tooth 204. In a preferred embodiment, the slot pitch 306 is about 4.71 mm.

Figure 4:
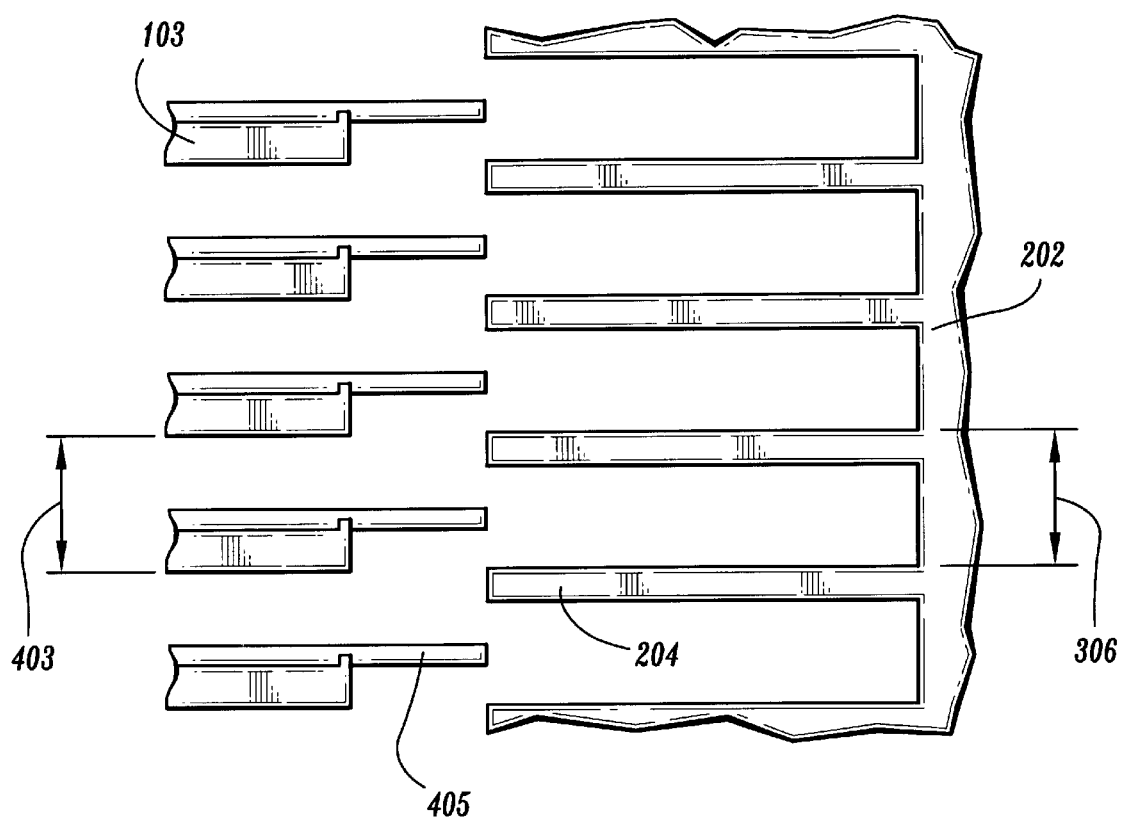
FIG. 4 is an exemplary illustration of multiple wafer forks in a position for loading a plurality of wafers onto a portion of a rail according to an aspect of the present invention.

FIG. 4 is an exemplary illustration of the multiple wafer forks 103 in a position for loading a plurality of wafers 405 onto a portion of the rail 202 according to an aspect of the present invention. The multiple wafer forks 103 facilitate the loading and unloading of wafers in batches of, for example, 5 wafers at a time, or an integer multiple of the lot size, and includes a variable pitch drive mechanism to allow the distance between wafer forks 103 to change during a wafer transferring process. For example, a wafer fork pitch 403 is adjusted to be wider when wafers are loaded and unloaded from a cassette (which can hold 25 wafers), and then readjusted to be narrower when loading and unloading a wafer carrier.

The wafer fork pitch 403 comprises a distance between a bottom of adjacent wafer forks and facilitates the loading and unloading of the wafers 405 safely onto the rails 202 having the slot pitch 306. Preferably, the wafer fork pitch 403 may be equivalent to the slot pitch 306, e.g., between about 4.61 mm and about 4.81 mm. Advantageously, the wafer fork pitch 403 reduces the chance of contact between the wafers and the teeth of the boat, thus preventing contamination, and provides for quicker and easier transferring of wafers onto the boat.

Although illustrative embodiments of the present invention have been described herein with reference to the accompanying drawings, it is to be understood that the present invention is not limited to those precise embodiments, and that various other changes and modifications may be affected therein by persons ordinarily skilled in the art without departing from the scope or spirit of the invention. All such changes and modifications are intended to be included within the scope of the invention as defined by the appended claims.

What is claimed is:

1. A system for improving throughput of semiconductor wafer processing for wafer carriers from a capacity of N product wafers to a capacity of N+y product wafers without increasing the number of furnaces, comprising:

a wafer carrier including a plurality of rails, the rails having a plurality of teeth for forming slots having a slot pitch for holding said semiconductor wafers, the wafer carrier being adapted to carry (N+y) product wafers in a flat zone while maintaining dimensions of the wafer carrier; and a wafer transferring mechanism comprising a plurality of wafer forks of a fork pitch between about 4.61 to 4.81 mm for loading and removing said semiconductor wafers from the wafer carrier; wherein the wafer transferring mechanism includes y/n forks where n is an integer value and y/n is a positive integer value.

2. The system of claim 1, wherein the flat zone is a region of the wafer carrier having a stable temperature for processing product wafers.

3. The system of claim 1, wherein the wafer transferring mechanism comprises 5 wafer forks.

4. The system of claim 1, wherein the slot pitch is between about 4.61 mm to about 4.81 mm.

5. The system of claim 1, wherein y is a lot size.

6. The system of claim 5, wherein y includes 25 product wafers.

7. A method of improved throughput in processing semiconductor wafers for a wafer boat having a capacity of N product wafers comprising the steps of:

providing a wafer carrier including a plurality of rails, the wafer carrier being adapted to carry an (N+y) number of product wafers in a flat zone while maintaining dimensions of the wafer boat; and providing a multiple fork wafer transfer mechanism having a plurality of wafer forks for loading and unloading the semiconductor wafers onto the wafer carrier.

8. The method of claim 3, wherein y is a lot size.

9. The method of claim 7, wherein y includes 25 product wafers.

10. The method of claim 7, wherein the flat zone is a region of the wafer carrier having a stable temperature for processing product wafers.

11. The method of claim 7, wherein the flat zone is provided by the plurality of rails having a slot pitch.

12. The method of claim 11, wherein the slot pitch is between about 4.61 mm to about 4.81 mm.

13. The method of claim 7, wherein the plurality of wafer forks load and unload the semiconductor wafers onto the wafer carrier at a fork pitch.

14. The method of claim 7, wherein the wafer transferring mechanism includes y/n forks where n is an integer value and y/n is a positive integer value.

* * * * *